United States Patent
Okunishi et al.

(10) Patent No.: US 8,829,970 B2
(45) Date of Patent: Sep. 9, 2014

(54) STANDARD CELL CIRCUIT, SEMICONDUCTOR INTEGRATED CIRCUIT, AND SEMICONDUCTOR INTEGRATED CIRCUIT DEVICE

(75) Inventors: Emi Okunishi, Hyogo (JP); Keiichi Yoshioka, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 240 days.

(21) Appl. No.: 13/556,512

(22) Filed: Jul. 24, 2012

(65) Prior Publication Data

US 2013/0027016 A1    Jan. 31, 2013

(30) Foreign Application Priority Data

Jul. 28, 2011 (JP) .................................. 2011-165725

(51) Int. Cl.
   *H03L 5/00*    (2006.01)
(52) U.S. Cl.
   USPC ............................... 327/333; 326/80; 326/81
(58) Field of Classification Search
   USPC ........................................ 327/333; 326/80, 81
   See application file for complete search history.

(56) References Cited

U.S. PATENT DOCUMENTS

| | | | |
|---|---|---|---|
| 6,424,585 B1* | 7/2002 | Ooishi | ........................ 365/226 |
| 7,272,046 B2* | 9/2007 | Tanzawa | .................. 365/185.18 |
| 8,106,701 B1* | 1/2012 | Huynh et al. | ................. 327/333 |
| 2011/0273940 A1* | 11/2011 | Tanzawa | .................. 365/189.11 |

FOREIGN PATENT DOCUMENTS

| | | |
|---|---|---|
| JP | 2003-174086 | 6/2003 |
| JP | 2004-22877 | 1/2004 |

* cited by examiner

*Primary Examiner* — Bao Q Vu
(74) *Attorney, Agent, or Firm* — Cooper & Dunham LLP

(57) ABSTRACT

A standard cell circuit including an input terminal to which input an input signal is input; an output terminal to output an output signal; a first wiring conductor, connected to an external power supply that outputs a first power supply voltage; a second wiring conductor to supply a second power supply voltage that is lower than the first power supply voltage; a standard cell to operate at the second power supply voltage supplied from the second wiring conductor; and a conversion circuit, connected to the first wiring conductor and the second wiring conductor, to convert the first power supply voltage input from the first wiring conductor into the second power supply voltage for output to the second wiring conductor.

16 Claims, 11 Drawing Sheets

FIG. 1A
PRIOR ART
FIG. 1B
PRIOR ART
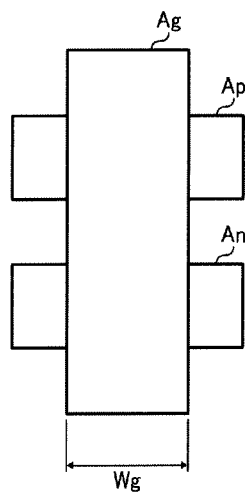
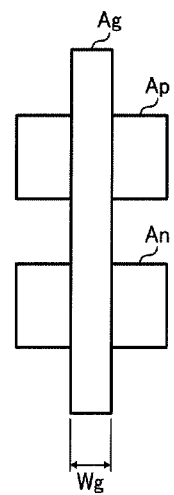

STANDARD CELL CIRCUIT, SEMICONDUCTOR INTEGRATED CIRCUIT, AND SEMICONDUCTOR INTEGRATED CIRCUIT DEVICE

CROSS-REFERENCE TO RELATED APPLICATION

This patent application is based on and claims priority pursuant to 35 U.S.C. §119 to Japanese Patent Application No. 2011-165725, filed on Jul. 28, 2011 in the Japan Patent Office, the entire disclosure of which is hereby incorporated by reference herein.

BACKGROUND

1. Technical Field

The present disclosure relates to a standard cell circuit, a semiconductor integrated circuit, and a semiconductor integrated circuit device.

2. Description of the Background Art

In recent years, increasing speed and functionality of digital circuits has led to speed-up and integration of semiconductor integrated circuit devices. As the circuit grows in size, layout of the semiconductor integrated circuit device is generally designed using a standard cell library.

A standard cell for automatic layout wiring, used for the standard cell library, includes a standard cell for multiple power supplies and a standard cell for a single power supply. A characteristic feature of the standard cell for multiple power supplies is that the standard cell includes a first power supply line and a second power supply line electrically insulated from the first power supply line, and the N-well is situated away from the whole peripheral boundary of the cell. In addition, the standard cell for a single power supply includes a power supply line connected to the first power supply line of the standard cell for multiple power supplies. Accordingly, even when the standard cell is arrayed adjacent to others in rows or columns, the N-well in the standard cell can be separated from the adjacent N-well of the standard cell.

FIG. 1A is a block diagram illustrating a configuration of a metal oxide semiconductor field effect transistor (MOSFET) formed according to a layout rule when a power supply voltage of 6.0 V is used. FIG. 1B is a block diagram illustrating a configuration of a MOSFET formed according to a layout rule when a power supply voltage of 1.8 V is used.

As illustrated in FIGS. 1A and 1B, a gate electrode Ag formed of polysilicon is formed on a positive channel (P-ch) region Ap corresponding to a P-channel type MOS transistor (pMOS transistor) and a negative channel (N-ch) region An corresponding to a N-channel type MOS transistor (nMOS transistor). Considering the withstand voltage of the gate electrode Ag, it is necessary for a width Wg of the gate electrode Ag to be wider as the power supply voltage increases. Accordingly, in general, as the power supply voltage increases, the layout area of the circuit also increases.

In the above-mentioned conventional standard cell for automatic layout wiring, as the layout area of the circuit that operates at the higher of the voltages supplied by the first power supply line or second power supply line increases, it becomes difficult to reduce the entire layout area of the standard cell for automatic layout wiring.

BRIEF SUMMARY

In one aspect of this disclosure, there is provided a standard cell circuit including an input terminal, an output terminal, a first wiring conductor, a second wiring conductor, a standard cell, and a conversion circuit. The first wiring conductor is connected to an external power supply that outputs a first power supply voltage. The second wiring conductor supplies a second power supply voltage that is lower than the first power supply voltage. The standard cell operates at the second power supply voltage supplied from the second wiring conductor. The conversion circuit, connected to the first wiring conductor and the second wiring conductor, converts the first power supply voltage input from the first wiring conductor into the second power supply voltage for output to the second wiring conductor.

In another aspect of this disclosure, there is provided a semiconductor integrated circuit including multiple standard cell circuits, including multiple input terminals, multiple output terminals, a first wiring conductor; a second wiring conductor; a standard cell; a regulator, an input level shifter, an output level shifter. The multiple input terminals, is provided in respective standard cell circuits and an input signal is input to the input terminal. The multiple output terminals, provided in respective standard cell circuits, output an output signal, and each of the output terminals other than that of an output-side standard cell circuit has one end connected to an input terminal of an adjacent standard cell circuit. The first wiring conductor is connected to an external power supply that outputs a first power supply voltage. The second wiring conductor supplies a second power supply voltage that is lower than the first power supply voltage. The standard cell operates at the second power supply voltage supplied from the second wiring conductor. The regulator, connected to the first wiring conductor and the second wiring conductor, converts the first power supply voltage input from the first wiring conductor into the second power supply voltage for output to the second wiring conductor. The input level shifter, connected between the input terminal and the standard cell, shifts the voltage level of the input signal input from the input terminal from a first power supply voltage level to a second power supply voltage level for output to the standard cell. The output level shifter, connected between the standard cell and the output terminal, shifts a voltage level of the output signal, output from the standard cell, from the second power supply voltage level to the first power supply voltage level for output via the output terminal.

In yet another aspect of this disclosure, there is provided a semiconductor integrated circuit device including the above-described semiconductor integrated circuit.

BRIEF DESCRIPTION OF THE DRAWINGS

The aforementioned and other aspects, features and advantages are better understood by reference to the following detailed description when considered in connection with the accompanying drawings, wherein:

FIG. 1A is a block diagram illustrating a configuration of a MOSFET formed according to a layout rule when a power supply voltage of 6.0 V is used as a comparative example;

FIG. 1B is a block diagram illustrating a configuration of a MOSFET formed according to a layout rule when a power supply voltage of 1.8 V is used, as a comparative example;

DETAILED DESCRIPTION OF PREFERRED EMBODIMENTS

Figure 2:
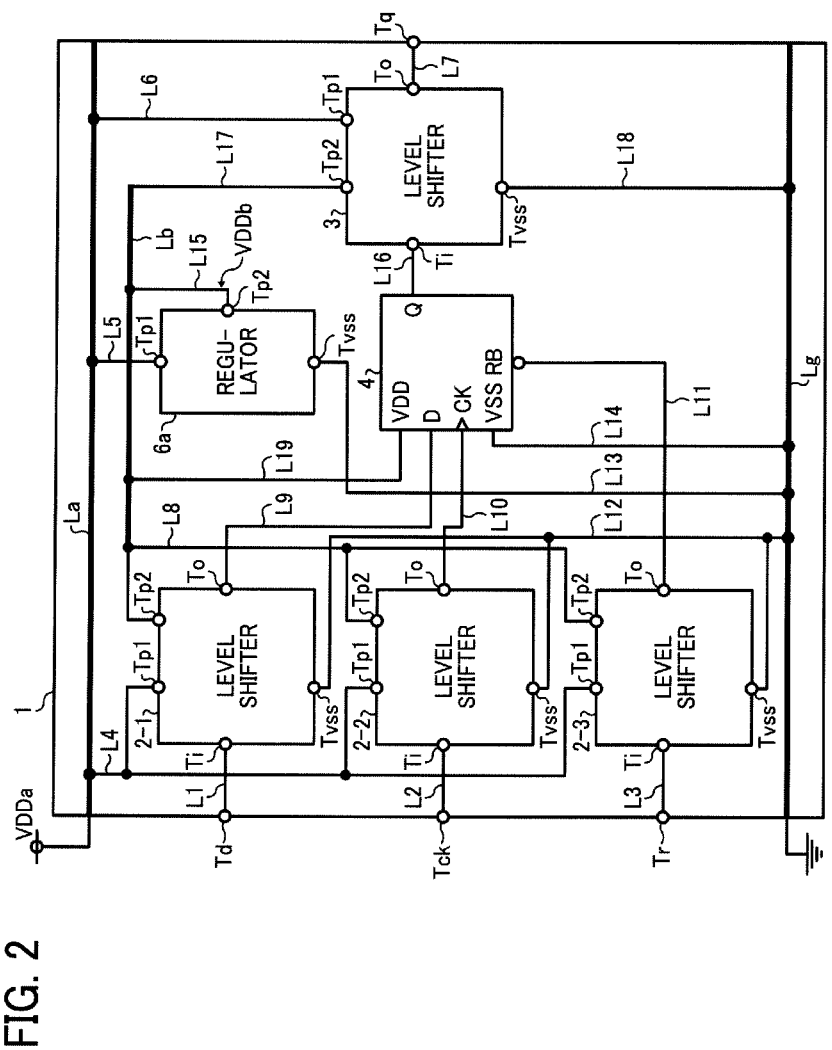
FIG. 2 is a diagram showing circuitry illustrating a standard cell circuit according to a first embodiment.

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result. Referring now to the drawings, wherein like reference numerals designate identical or corresponding parts throughout the several views, particularly to FIGS. 2 through 16, standard cell circuits according to illustrative embodiments are described.

Standard Cell Circuit/First Embodiment

Figure 3:
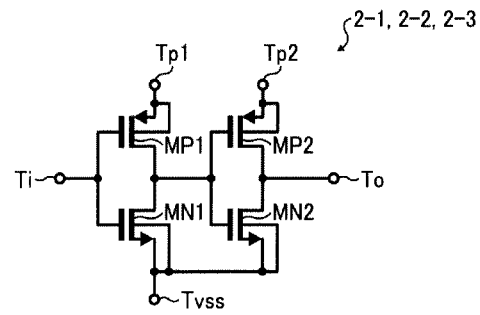
FIG. 3 is a circuit diagram illustrating input level shifters shown in FIG. 2.
Figure 4:
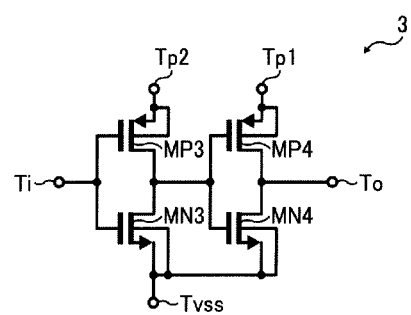
FIG. 4 is a circuit diagram illustrating an output level shifter shown in FIG. 2.
Figure 5:
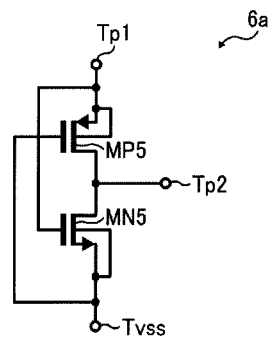
FIG. 5 is a circuit diagram illustrating a regulator shown in FIG. 2.
Figure 6:
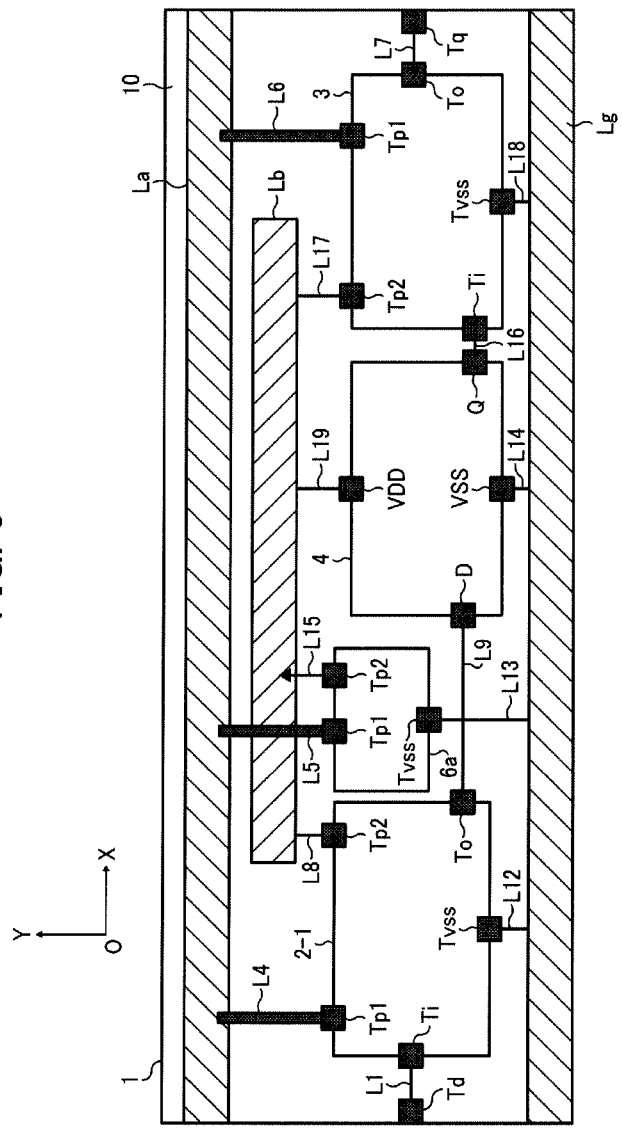
FIG. 6 is a plan view illustrating a layout of the standard cell circuit shown in FIG. 2.

FIG. 2 is a diagram showing circuitry illustrating a standard cell circuit 1 according to a first embodiment. In FIG. 2, the standard cell circuit 1 includes a standard cell 4, level shifters 2-1, 2-2, and 2-3 (input level shifters), a regulator 6a, and a level shifter 3 (output level shifter). FIG. 3 is a circuit diagram illustrating the level shifters 2-1, 2-2, and 2-3 shown in FIG. 2. FIG. 4 is a circuit diagram illustrating the level shifter 3 shown in FIG. 2. FIG. 5 is a circuit diagram illustrating the regulator 6a shown in FIG. 2. FIG. 6 is a plan view illustrating a layout of the standard cell circuit 1.

In FIGS. 2 and 6, the standard cell circuit 1 is used, for example, when designing circuits using a standard cell library for automatic layout wiring of a semiconductor integrated circuit. As illustrated in FIG. 6, the standard cell circuit 1 is formed on a substrate 10 containing multiple layers. In addition, by arranging multiple standard cell circuits 1 along a X axis shown in FIG. 6, a cell line (in semiconductor integrated circuit) can be configured (For example, standard cell circuits 1-1, 1-2, and 1-3 shown in FIG. 14).

In FIG. 2, the standard cell circuit 1 is connected to an (external) power supply (not shown) to output a power supply voltage VDDa of 6 V (volts), which operates as a D-type flip-flop circuit. The standard cell circuit 1 has a data input terminal Td to which data is input, a clock input terminal Tck to which a clock signal is input, a reset input terminal Tr to which a reset signal is input, an output terminal Tq to output an output signal, the level shifters 2-1, 2-2, 2-3, and 3, the regulator 6a, the standard cell 4 functioning as a D-type flip-flop circuit to operate at power supply voltage of 1.8 V, wiring conductors La, Lb, and Lg, and lines (wiring lines) L1 through L19. Herein, the data, the clock signal, and the reset signal, input to the standard cell circuit 1, have a voltage level of 6 V, respectively.

As illustrated in FIG. 3, each of the level shifters 2-1, 2-2, and 2-3 has an input terminal Ti, an output terminal To, power supply terminals Tp1 and Tp2, a ground terminal Tvss, positive channel metal-oxide semiconductor (pMOS) transistors MP1 and MP2, and negative channel MOS (nMOS) transistors MN1 and MN2.

The pMOS transistor MP1 has a gate connected to the input terminal Ti, a source connected to the power supply terminal Tp1, a drain, and a well connected to the source of the pMOS transistor MP1. The nMOS transistor MN1 has a gate connected to the input terminal Ti, a source connected to the ground terminal Tvss, a drain connected to the drain of the pMOS transistor MP1, and a well connected to the source of the nMOS transistor MN1.

The pMOS transistor MP2 has a gate connected to the drains of the pMOS transistor MP1 and nMOS transistor MN1, a source connected to the power supply terminal Tp2, a drain connected to the output terminal To, and a well connected to the source of the pMOS transistor MP2. The nMOS transistor MN2 has a gate connected to the drains of the pMOS transistor MP1 and nMOS transistor MN1, a source connected to the ground terminal Tvss, a drain connected to the output terminal To, and a well connected to the sources of the nMOS transistors MN1 and MN2.

As illustrated in FIG. 4, the level shifter 3 has an input terminal Ti, an output terminal To, power supply terminals Tp1 and Tp2, a ground terminal Tvss, pMOS transistors MP3 and MP4, and nMOS transistors MN3 and MN4.

The pMOS transistor MP3 has a gate connected to the input terminal Ti, a source connected to the power supply terminal Tp2, a drain, and a well connected to the source of the pMOS transistor MP3. The nMOS transistor MN3 has a gate connected to the input terminal Ti, a source connected to the ground terminal Tvss, a drain connected to the drain of the pMOS transistor MP3, and a well connected to the source of the nMOS transistor MN3.

The pMOS transistor MP4 has a gate connected to the drains of the pMOS transistor MP3 and nMOS transistor MN3, a source connected to the power supply terminal Tp1, a drain connected to the output terminal To, and a well connected to the source of the pMOS transistor MP4. The nMOS transistor MN4 has a gate connected to the drains of the pMOS transistor MP3 and nMOS transistor MN3, a source connected to the ground terminal Tvss, a drain connected to the output terminal To, and a well connected to the sources of the nMOS transistors MN3 and MN4.

As illustrated in FIG. 5, the regulator 6a has power supply terminals Tp1 and Tp2, a ground terminal Tvss, a pMOS transistor MP5, and an nMOS transistor MN5. The pMOS transistor MP5 has a gate connected to the ground terminal Tvss, a source connected to the power supply terminal Tp1, a drain connected to the power supply terminal Tp2, and a well connected to the source of the pMOS transistor MP5. The nMOS transistor MN5 has a gate connected to the power supply terminal Tp1, a source connected to the ground terminal Tvss, a drain connected to the power supply terminal Tp2, and a well connected to the source of the nMOS transistor MN5.

In FIG. 2, the external power supply to output the power supply voltage of 6 V is connected to the respective power supply terminals Tp1 of the level shifters 2-1, 2-2, and 2-3 via a high-voltage (high power supply voltage) wiring conductor La and a line L4, is connected to the power supply terminal Tp1 of the regulator 6a via the high-voltage wiring conductor La and a line L5, and is connected to the power supply terminal Tp1 of the level shifter 3 via the high-voltage wiring conductor La and a line L6. The ground terminals Tvss of the level shifters 2-1, 2-2, and 2-3 are electrically grounded via a line L12 and a ground-voltage wiring conductor Lg, the ground terminal Tvss of the regulator 6a is electrically grounded via a line L13 and the ground-voltage wiring conductor Lg, a ground terminal VSS of the standard cell circuit 4 is electrically grounded via a line L14 and the ground-voltage wiring conductor Lg, and the ground terminal Tvss of the level shifter 3 is electrically grounded via a line L18 and the ground-voltage wiring conductor Lg.

In the standard cell circuit 1 shown in FIG. 2, the data input terminal Td is connected to the input terminal Ti of the level shifter 2-1 via a line L1, the clock input terminal Tck is connected to the input terminal Ti of the level shifter 2-2 via a line L2, and the reset input terminal Tr is connected to the input terminal Ti of the level shifter 2-3 via a line L3. The output terminal To of the level shifter 2-1 is connected to a data terminal D of the standard cell 4 via a line L9, the output terminal To of the level shifter 2-2 is connected to a clock terminal CK of the standard cell 4 via a line L10, and the output terminal To of the level shifter 2-3 is connected to a reverse reset terminal RB of the standard cell 4 via a line L11.

The power supply terminal Tp2 of the regulator 6a is respectively connected to the power supply terminals Tp2 of the level shifters 2-1, 2-2, and 2-3 via a line LI5, a low-voltage (power supply voltage) wiring conductor Lb, and a line L8, is connected to a power supply terminal VDD of the standard cell 4 via the line LI5, the low-voltage wiring conductor Lb, and a line L19, and is connected to the power supply terminal Tp2 of the level shifter 3 via the line L15, the low-voltage wiring conductor Lb, and a line L17.

Further, in FIG. 2, an output terminal Q of the standard cell 4 is connected to the input terminal Ti of the level shifter 3 via a line L16. The output terminal To of the level shifter 3 is connected to the output terminal Tq of the standard cell circuit 1 via a line L7.

In FIG. 2, the external power supply outputs the power supply voltage VDDa of 6 V to the power supply terminals Tp1 of the level shifters 2-1, 2-2, 2-3, and 3 and the regulator 6a. The regulator 6a converts the input power supply voltage VDDa of 6V into a power supply voltage VDDb of 1.8V for output to the power supply terminals Tp2 of the level shifters 2-1, 2-2, 2-3, and 3 and the power supply terminal VDD of the standard cell 4.

The level shifter 2-1 shifts the voltage level of the data input from the data input terminal Td from 6V to 1.8 V, and outputs the voltage-shifted data to the data terminal D of the standard cell 4. The level shifter 2-2 shifts the voltage level of the clock signal input from the clock input terminal Tck from 6V to 1.8 V, and outputs the voltage-shifted clock signal to the clock terminal CK of the standard cell 4. The level shifter 2-3 shifts the voltage level of the reset signal input from the reset input terminal Tr from 6.0 V to 1.8 V, and outputs the voltage-shifted reset signal to the reverse reset terminal RB of the standard cell 4.

In FIG. 2, the standard cell 4 operates at the low power supply voltage VDDb, and generates an output signal having a voltage level of 1.8V for output to the level shifter 3. The level shifter 3 shifts the voltage level of the output signal from the standard cell 4 from 6V to 1.8 V, and outputs the voltage-shifted output signal outside via the output terminal Tq of the standard cell circuit 1.

With reference to FIG. 6, a layout of the standard cell circuit 1 is described below. Herein, although the level shifters 2-2 and 2-3 are provided with the level shifter 2-1 in FIGS. 6 and 8 through 16, the figures of the level shifters 2-2 and 2-3 are omitted for simplicity.

In FIG. 6, the ground-voltage wiring conductor Lg is formed along one side extending in parallel to the X-axis and the high-voltage wiring conductor La is formed near the other side extending parallel to the X-axis. The low-voltage wiring conductor Lb is formed extending parallel to the X-axis, inboard of the high-voltage wiring conductor La. Neither end of the low-voltage wiring conductor Lb contacts the sides extending parallel to the Y-axis of the standard cell circuit 1.

Herein, the wiring line L5 and the low-voltage wiring conductor Lb are formed in different layers of the substrate 10 and are electrically insulated from each other. Similarly, the wiring line L9 and the wiring line L13 are formed in different layers of the substrate 10 and are electrically insulated from each other.

In FIG. 6, the level shifter 2-1, the regulator 6a, the standard cell 4, and the level shifter 3 are arranged between the low-voltage wiring conductor Lb and the ground-voltage wiring conductor Lg, along the X-axis. The level shifters 2-1, 2-2, 2-3, and 3, and the regulator 6a are formed in accordance with the layout rule when the power supply voltage VDDa of 6V is used, so as to prevent the gates of the pMOS transistors MP1 through MP5 and the nMOS transistors MN1 through MN5 (see FIGS. 3 through 5) from being broken caused by the signals having the voltage level of 6 V.

By contrast, the standard cell 4 is formed in accordance with the layout rule when the low power supply voltage VDDb that is lower than the power supply voltage VDDa is used.

Accordingly, widths of gate electrodes of respective MOS transistors constituting the standard cell 4 are narrower than those of gate electrodes of the pMOS transistors MP1 through MP5 and nMOS transistors MN1 through MN5 constituting the level shifters 2-1, 2-2, 2-3, and 3 and the regulator 6a. Therefore, a layout area of the standard cell circuit 1 can be smaller than that of a conventional standard cell circuit operating as a D-type flip-flop circuit with the high power supply voltage VDDa.

As described above, in the standard cell circuit 1 according to the present embodiment, by providing the level shifters 2-1, 2-2, and 2-3, the data, clock signal, and reset signal having a voltage level of 1.8 V can be output to the standard cell 4. Therefore, the transistors constituting the standard cell 4 can be formed according to the layout rule when the power supply voltage of 1.8 V is used, which can reduce the layout area of the standard cell 4 compared to the conventional standard cell.

In addition, by providing the regulator 6a, the lower power supply voltage VDDb, converted from the higher power supply voltage VDDa, can be supplied to the standard cell 4, and the layout area of the standard cell 4 can be reduced compared to the conventional standard cell.

In addition, the gate area of the standard cell 4 formed according to the layout rule when the power supply voltage of 1.8 V is used is smaller than the gate area of the conventional standard cell according to the layout rule when the power supply voltage of 6.0 V is used, which can reduce power consumption.

Variation of Regulator

Figure 7:
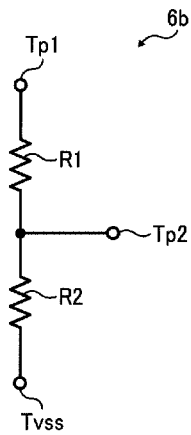
FIG. 7 is a circuit diagram illustrating a regulator according to a variation of the regulator shown in FIG. 5.

FIG. 7 is a circuit diagram illustrating a regulator 6b according to a variation of the regulator 6a. This regulator 6b may be also used in the below described embodiments shown in FIGS. 6, 8 through 16, instead of the regulator 6a. In FIG. 7, the regulator 6b includes resistors R1 and R2 in addition to the power supply terminals Tp1 and Tp2 and the ground terminal Tvss. Herein, the resistors R1 and R2 are connected between the power supply terminal Tp1 and the ground terminal Tvss via a junction node that is connected to the power supply terminal Tp2. The configuration of the regulator 6b can achieve effects similar to those of the regulator 6a described above.

Second Embodiment

Figure 8:
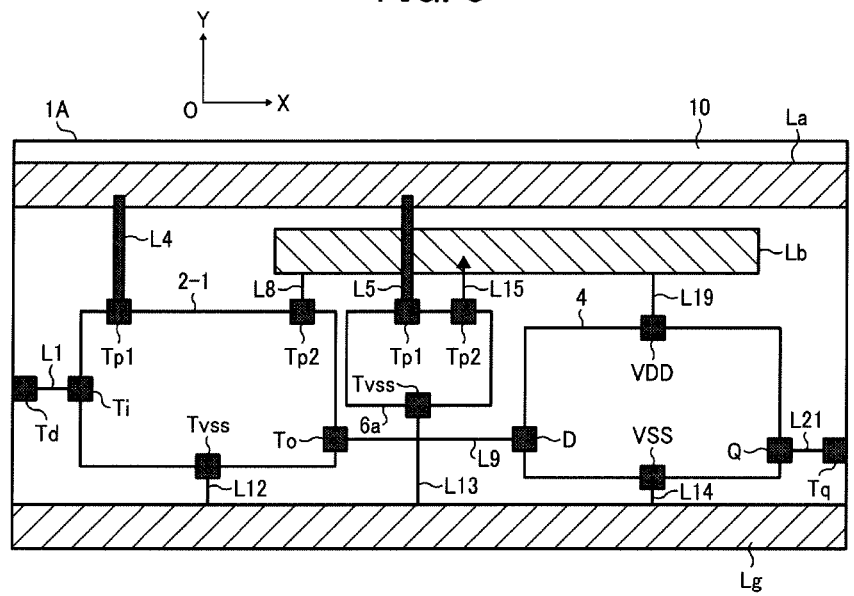
FIG. 8 is a plan view illustrating a layout of a standard cell circuit according to a second embodiment.

FIG. 8 is a plan view illustrating a layout of a standard cell circuit 1A according to a second embodiment. In FIG. 8, compared to the standard cell circuit 1 shown in FIG. 6, the standard cell circuit 1A does not include the level shifter 3 (output level shifter). However, because other than the difference described above in the standard cell circuit 1A has a configuration similar to the configuration of the standard cell circuit 1 in the first embodiment, other components of the standard cell circuit 1A are represented by identical numerals and the description thereof is omitted below.

In FIG. 8, since the output terminal Q of the standard cell 4 is connected to the output terminal Tq of the standard cell circuit 1A via a line L21, the output terminal Tq outputs the output signal having a voltage level of 1.8 V outside.

The configuration of the second embodiment can achieve effects similar to those of the standard cell circuit 1 described above.

Third Embodiment

Figure 9:
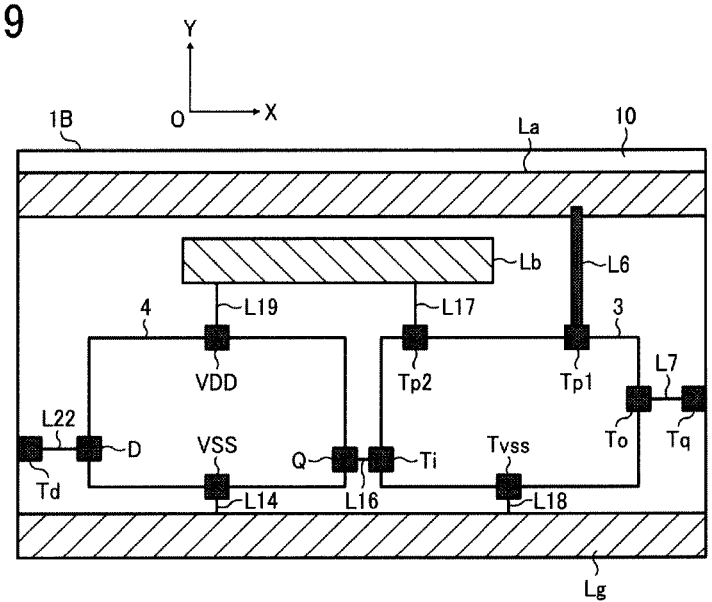
FIG. 9 is a plan view illustrating a layout of a standard cell circuit according to a third embodiment.

FIG. 9 is a plan view illustrating a layout of a standard cell circuit 1B according to a third embodiment. In FIG. 9, compared to the standard cell circuit 1 shown in FIG. 6, the standard cell circuit 1B does not include the level shifter 2-1, 2-2, and 2-3 (input level shifters), and the regulator 6a. However, because other than the difference described above in the standard cell circuit 1B has a configuration similar to the configuration of the standard cell circuit 1 in the first embodiment, other components of the standard cell circuit 1B are represented by identical numerals and the description thereof is omitted below.

In FIG. 9, the data input terminal Td is connected to the data terminal D of the standard cell 4 via a line L22. The data having a voltage level of 1.8 V is input to the data terminal D of the standard cell 4 via the data input terminal Td and the line L22.

The configuration of the third embodiment can achieve effects similar to those of the standard cell circuit 1 described above.

This the standard cell circuit 1B shown in FIG. 9 is used for an arrangement in which, at least one of the standard cell circuit 1, 1A, 1B, 1C, 1D, 1E, 1F and 1G (1C through 1G are described later) is disposed adjacent to at least one side of the data input terminal Td or the output terminal Tq of the standard cell circuit 1B. With this arrangement, at least one end of the low-voltage wiring conductor Lb of the standard cell circuit 1B is electrically connected to the low-voltage wiring conductor Lb of the adjacent standard cell circuit 1, 1A, 1B, 1C, 1D, 1E, 1F, and 1G.

For example, as one arrangement, a semiconductor integrated circuit can be formed by two standard cells including the standard cell circuit 1B shown in FIG. 9, including the output level shifter 3, and the standard cell circuit 1A shown in FIG. 8 including the input level shifters 2-1, 2-2, and 2-3 and the regulator 6a.

Fourth Embodiment

Figure 10:
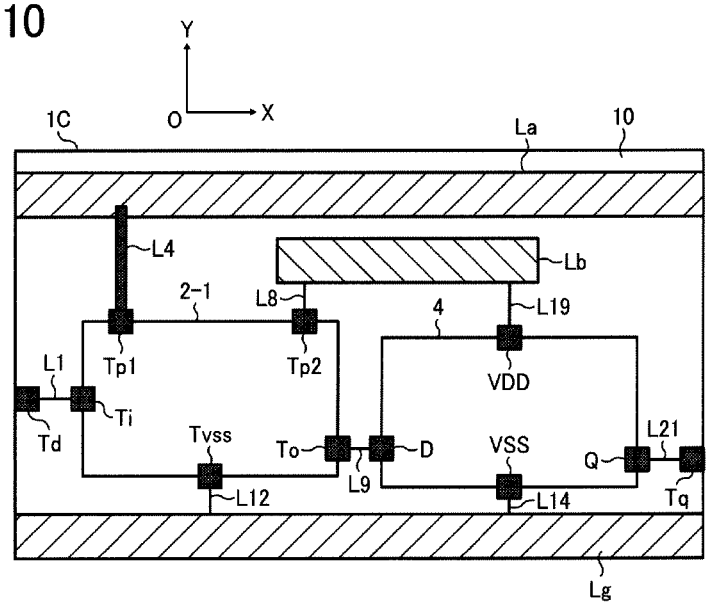
FIG. 10 is a plan view illustrating a layout of a standard cell circuit according to a fourth embodiment.

FIG. 10 is a plan view illustrating a layout of a standard cell circuit 1C according to a fourth embodiment. In FIG. 10, compared to the standard cell circuit 1 shown in FIG. 6, the standard cell circuit 1C does not include the regulator 6a and the level shifter (output level shifter) 3. However, because other than the difference described above the standard cell circuit 1C has a configuration similar to the configuration of the standard cell circuit 1 in the first embodiment, other components of the standard cell circuit 1C are represented by identical numerals and the description thereof is omitted below.

In FIG. 10, since the output terminal Q of the standard cell 4 is connected to the output terminal Tq of the standard cell circuit 1 via the line L21, the output terminal Tq outputs the output signal having the voltage level of 1.8 V.

The configuration of the fourth embodiment can achieve effects similar to those of the standard cell circuit 1 described above.

This the standard cell circuit 1C shown in FIG. 10 is used for an arrangement in which at least one of the standard cell circuit 1, 1A, 1B, 1C, 1D, 1E, 1F and 1G (1D through 1G are described later) is disposed adjacent to at least one side of the data input terminal Td side or the output terminal Tq side of the standard cell circuit 1C. With this arrangement, at least one end of the low-voltage wiring conductor Lb of the standard cell circuit 1C is electrically connected to the low-voltage wiring conductor Lb of the adjacent standard cell circuit 1, 1A, 1B, 1C, 1D, 1E, 1F, and 1G.

For example, as one arrangement, a semiconductor integrated circuit can be formed by two standard cells including the standard cell circuit 1C shown in FIG. 10, including the input level shifters 2-1, 2-2, and 2-2, and a standard cell circuit 1E (to be described later) shown in FIG. 12 including the regulator 6a and the output level shifter 3.

Fifth Embodiment

Figure 11:
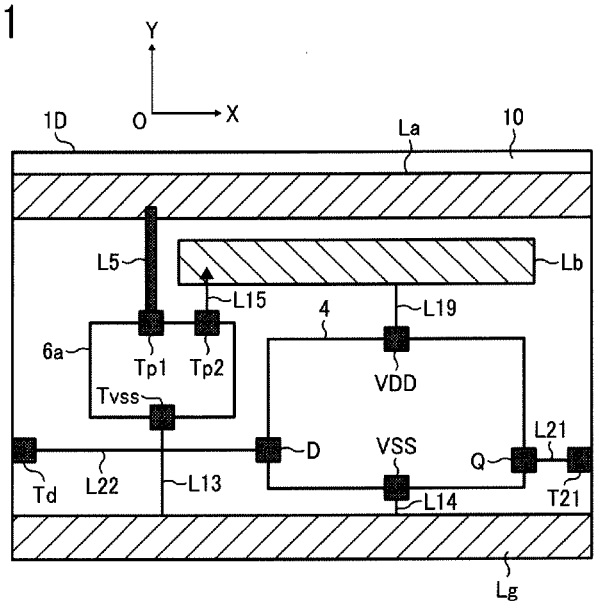
FIG. 11 is a plan view illustrating a layout of a standard cell circuit according to a fifth embodiment.

FIG. 11 is a plan view illustrating a layout of a standard cell circuit 1D according to a fifth embodiment. In FIG. 11, compared to the standard cell circuit 1 shown in FIG. 6, the standard cell circuit 1D does not include the level shifters 2-1, 2-2, 2-3, and 3. However, because other than the difference described above in the standard cell circuit 1D has a configuration similar to the configuration of the standard cell circuit 1 in the first embodiment, other components of the standard cell circuit 1D are represented by identical numerals and the description thereof is omitted below.

In FIG. 11, the data input terminal Td is connected to the data terminal D of the standard cell 4 via the line L22. The data having a voltage level of 1.8 V is input to the data terminal D of the standard cell 4 via the data input terminal Td and the line L22. In addition, since the output terminal Q of the standard cell 4 is connected to the output terminal Tq of the standard cell circuit 1 via the line L21, the output terminal Tq outputs the output signal having the voltage level of 1.8 V.

The configuration of the fifth embodiment can achieve effects similar to those of the standard cell circuit 1 described above.

Sixth Embodiment

Figure 12:
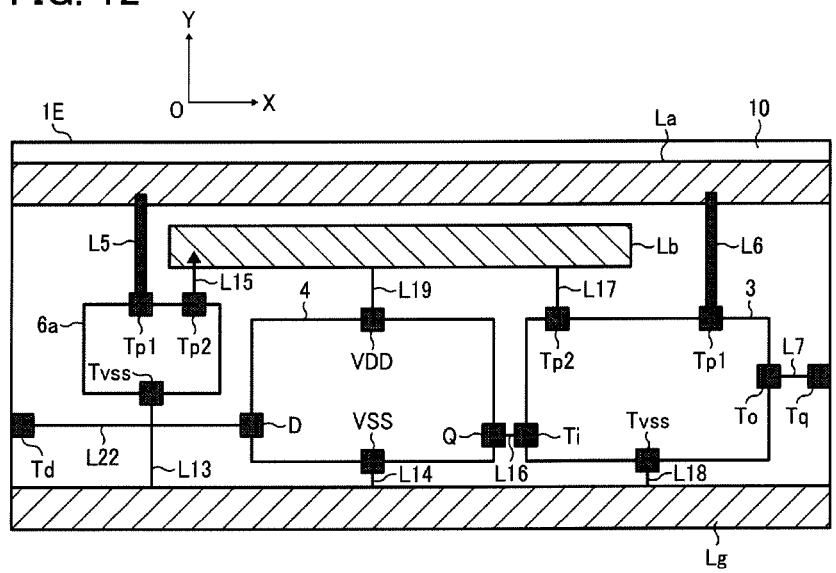
FIG. 12 is a plan view illustrating a layout of a standard cell circuit according to a sixth embodiment.

FIG. 12 is a plan view illustrating a layout of a standard cell circuit 1E according to a sixth embodiment. In FIG. 12, compared to the standard cell circuit 1 shown in FIG. 6, the standard cell circuit 1E does not include the level shifters 2-1, 2-2, and 2-3 (input level shifters). However, because other than the difference described above in the standard cell circuit 1E has a configuration similar to the configuration of the standard cell circuit 1 in the first embodiment, other components of the standard cell circuit 1E are represented by identical numerals and the description thereof is omitted below.

In FIG. 12, the data input terminal Td is connected to the data terminal D of the standard cell 4 via the line L22. The data having a voltage level of 1.8 V is input to the data terminal D of the standard cell 4 via the data input terminal Td and the line L22.

The configuration of the sixth embodiment can achieve effects similar to those of the standard cell circuit 1 described above.

Seventh Embodiment

Figure 13:
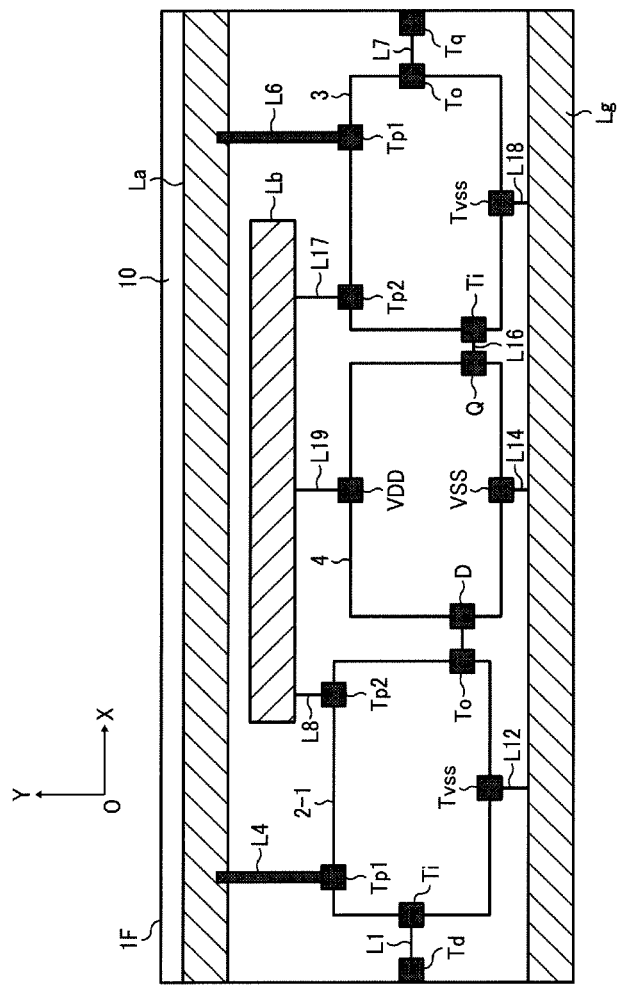
FIG. 13 is a plan view illustrating a layout of a standard cell circuit according to a seventh embodiment.

FIG. 13 is a plan view illustrating a layout of a standard cell circuit 1F according to a seventh embodiment. In FIG. 13, compared to the standard cell circuit 1 shown in FIG. 2, the standard cell circuit 1F does not include the regulator 6a. However, because other than the difference described above in the standard cell circuit 1F has a configuration similar to the configuration of the standard cell circuit 1 in the first embodiment, other components of the standard cell circuit 1F are represented by identical numerals and the description thereof is omitted below.

The configuration of the seventh embodiment can achieve effects similar to those of the standard cell circuit 1 described above.

This the standard cell circuit 1F shown in FIG. 13 is used for an arrangement in which at least one of the standard cell circuit 1, 1A, 1B, 1C, 1D, 1E, 1F and 1G (1G is described later) is disposed adjacent to at least one side of the data input terminal Td or the output terminal Tq of the standard cell circuit 1F. With this arrangement, at least one of the low-voltage wiring conductor Lb of the standard cell circuit 1F is electrically connected to one end of the low-voltage wiring conductor Lb of the adjacent standard cell circuit 1, 1A, 1B, 1C, 1D, 1E, 1F, and 1G.

For example, as one arrangement, a semiconductor integrated circuit can be formed by two standard cells including the standard cell circuit 1F shown in FIG. 13, including the input level shifter 2-1, 2-2 and 2-2 and the output level shifter 3, and a standard cell circuit 1D shown in FIG. 11 including the regulator 6a.

Configuration of Semiconductor Integrated Circuit/First Arrangement

Figure 14:
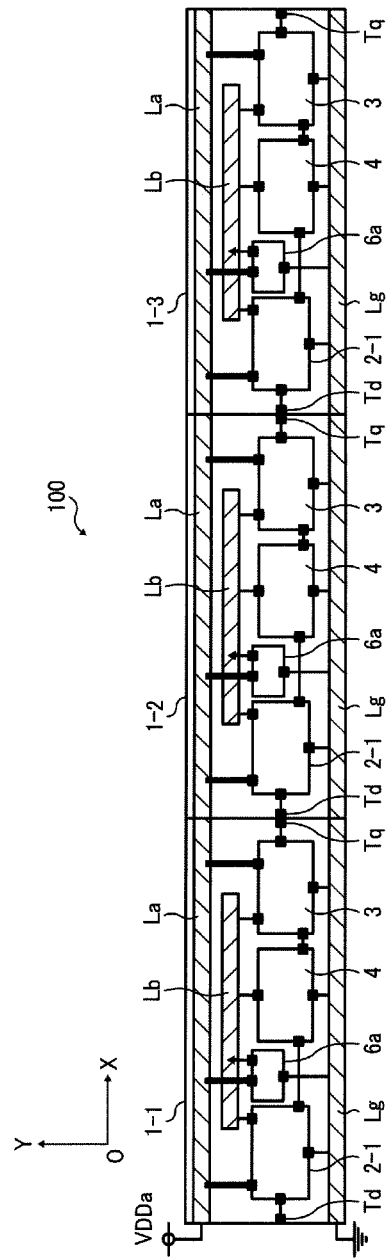
FIG. 14 is a plan view illustrating a layout of a semiconductor integrated circuit according to a first arrangement.

FIG. 14 is a plan view illustrating a layout of a semiconductor integrated circuit 100 according to a first arrangement In FIG. 14, the semiconductor integrated circuit 100 includes there standard cell circuits constituted similarly to the standard cell circuit 1, and the three standard cell circuits are arranged adjacent respectively. The standard cell circuits include an input-side standard cell circuit 1-1, a central standard cell circuit 1-2, and an output-side standard cell circuit 1-3.

In FIG. 14, one end of the high-voltage wiring conductor La of the input-side standard cell circuit 1-1 contacts one end of the high-voltage wiring conductor La of the central second standard cell circuit 1-2 to electrically connect to each other. The other end of the high-voltage wiring conductor La of the central standard cell circuit 1-2 contacts one end of the high-voltage wiring conductor La of the output-side standard cell circuit 1-3 to electrically connect to each other. One end of the ground-voltage wiring conductor Lg of the input-side standard cell circuit 1-1 contacts one end of the ground-voltage wiring conductor Lg of the central standard cell circuit 1-2 to electrically connect to each other. The other end of the ground-voltage wiring conductor Lg of the central standard cell circuit 1-2 contacts one end of the ground-voltage wiring conductor Lg of the output-side standard cell circuit 1-3 to electrically connect to each other.

In addition, in FIG. 14, the output terminal Tq of the input-side standard cell circuit 1-1 contacts the (data) input terminal Td of the central standard cell circuit 1-2 to electrically connect to each other. The output terminal Tq of the central standard cell circuit 1-2 contacts the input terminal Td of the output-side standard cell circuit 1-3 to electrically connect to each other.

As described above, layout area and power consumption of these standard cell circuits 1-1, 1-2, and 1-3 can be smaller than the conventional standard cells. Therefore, in the semiconductor integrated circuit 100, the layout area and the power consumption can be reduced, compared to a semiconductor integrated circuit using three conventional standard cells.

Second Arrangement of the Semiconductor Integrated Circuit

Figure 15:
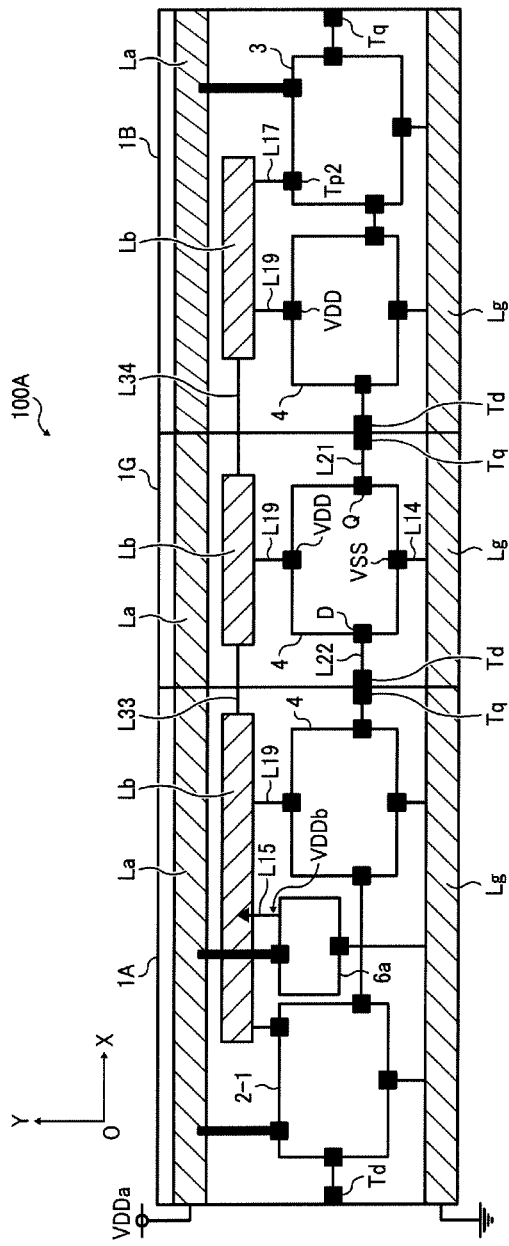
FIG. 15 is a plan view illustrating a layout of a semiconductor integrated circuit according to a second arrangement.

FIG. 15 is a plan view illustrating a layout of a semiconductor integrated circuit 100A according to a second arrangement. In FIG. 15, compared to the semiconductor integrated circuit 100, the semiconductor integrated circuit 100A includes the standard cell circuit 1A shown in FIG. 8 as an input-side standard cell circuit, instead of the standard cell circuit 1-1, a standard cell circuit 1G as a central standard cell circuit, instead of the standard cell circuit 1-2, and the standard cell circuit 1B shown in FIG. 9 as an output-side standard cell, instead of the standard cell circuit 1-3.

In FIG. 15, the central standard cell circuit 1G includes the standard cell 4, the wiring conductors La, Lb, and Lg, and lines L14, L21, and L22, the input terminal Td, and the output terminal Tq. In the central standard cell circuit 1G the wiring conductors La, Lb, and Lg are formed similar to the wiring conductors La, Lb, and Lg in the standard cell circuits 1, and 1A through 1F.

In the central standard cell circuit 1G, the input terminal Td of the central standard cell circuit 1G is connected to the data terminal D of the standard cell 4 via the line L22. The ground terminal Vss of the standard cell 4 is connected to the ground-voltage wiring conductor Lg of the central standard cell circuit 10 via the line L14. The power supply terminal VDD of the standard cell 4 is connected to the low-voltage wiring conductor Lb of the central standard cell circuit 10 via the line L19. The output terminal Q of the standard cell 4 is connected to the output terminal Tq of the central standard cell circuit 1G via the line L21.

In FIG. 15, one end of the high-voltage wiring conductor La of the input-side standard cell circuit 1A contacts one end of the high-voltage wiring conductor La of the central standard cell circuit 1G to electrically connect to each other. The other end of the high-voltage wiring conductor La of the central standard cell circuit 10 contacts one end of the high-voltage wiring conductor La of the output-side standard cell circuit 1B to electrically connect to each other. One end of the ground-voltage wiring conductor Lg of the input-side standard cell circuit 1A contacts one end of the ground-voltage wiring conductor Lg of the central standard cell circuit 1G to electrically connect to each other. The other end of the ground-voltage wiring conductor Lg of the central standard cell circuit 1G contacts one end of the ground-voltage wiring conductor Lg of the output-side standard cell circuit 1B to electrically connect to each other.

In FIG. 15, the output terminal Tq of the input-side standard cell circuit 1A contacts the (data) input terminal Td of the central standard cell circuit 1G to electrically connect to each other. The output terminal Tq of the central standard cell circuit 1G contacts the input terminal Td of the output-side standard cell circuit 1B to electrically connect to each other.

Further, one end of the low-voltage wiring conductor Lb of the input-side standard cell circuit 1A is connected to one end of the low-voltage wiring conductor Lb of the central standard cell circuit 1G via a line L33. The other end of the low-voltage wiring conductor Lb of the central standard cell circuit 1G is connected to the low-voltage wiring conductor Lb of the output-side standard cell circuit 1B via a line L34.

Accordingly, in FIG. 15, the power supply voltage VDDb from the regulator 6a of the input-side standard cell circuit 1A is output to the power supply terminal VDD of the standard cell 4 in the central standard cell circuit 1G via the line L15 and the low-voltage wiring conductor Lb of the input-side standard cell circuit 1A, the line L33, the low-voltage wiring conductor Lb and the line L19 of the central standard cell circuit 1G. In addition, the power supply voltage VDDb from the regulator 6a of the input-side standard cell circuit 1A is output to the power supply terminal VDD of the standard cell 4 in the output-side standard cell circuit 1B, via the line L15 and the low-voltage wiring conductor Lb of the input-side standard cell circuit 1A, the line L33, the low-voltage wiring conductor Lb of the central standard cell circuit 1G, the line L34, and the low-voltage wiring conductor Lb and the line L19 of the output-side standard cell circuit 1B.

The power supply voltage VDDb from the regulator 6a of the input-side standard cell circuit 1A is output to the power supply terminal Tp2 of the level shifter 3 in the out-side standard cell circuit 1B, via the line L15 and the low-voltage wiring conductor Lb of the input-side standard cell circuit 1A, the line L33, the low-voltage wiring conductor Lb of the central standard cell circuit 10, the line L34, and the low-voltage wiring conductor Lb and the line L17 of the output-side standard cell circuit 1B.

As illustrated in FIG. 15, the output signal having a voltage level of 1.8 V from the standard cell 4 of the input-side standard cell circuit 1A is directly output to the standard cell 4 of the central standard cell circuit 1G without the output level shifters 3 and the input level shifter 2-1. The output signal having the voltage level of 1.8 V from the central standard cell circuit 1G is directly output to the standard cell 4 of the output-side standard cell circuit 1B without the output level shifters 3 and the input level shifter 2-1.

Accordingly, in the semiconductor integrated circuit 100A according to the present embodiment, the level shifters 3 and 2-1 are omitted in the adjacent input-side standard cell circuit 1A and the central standard cell circuit 1G, and the level shifters 3 and 2-1 are omitted in the adjacent central standard cell circuit 1G and the output-side standard cell circuit 1B, and the regulator 6a is omitted in the central standard cell circuit 1G and the output-side standard cell circuit 1B. Accordingly, the layout area of the semiconductor integrated circuit 100A can be dramatically reduced, compared to the semiconductor integrated circuit 100 shown in FIG. 14.

Variations of Second Arrangement

Although the regulator 6a is provided in the input-side standard cell circuit 1A shown in FIG. 15, alternatively, the regulator 6a may be provided any positions of the standard cell circuit.

More specifically, as a first variation of the second arrangement, the regulator 6a is provided in the center standard cell circuit. In this variation, compared to the second arrangement shown in FIG. 15, the semiconductor integrated circuit (not shown) includes the standard cell circuit 1C shown in FIG. 10 as an input-side standard cell circuit, instead of the standard cell circuit 1A, the standard cell circuit 1D as a central standard cell circuit, instead of the standard cell circuit 1G and the standard cell circuit 1B shown in FIG. 9 as an output-side standard cell.

Alternatively, as a second variation of the second arrangement, the regulator 6a is provided in the output-side standard cell circuit. In this variation, compared to the second arrangement shown in FIG. 15, the semiconductor integrated circuit (not shown) includes the standard cell circuit 1C shown in FIG. 10 as an input-side standard cell circuit, instead of the standard cell circuit 1A, the standard cell circuit 1G as a central standard cell circuit, and the standard cell circuit 1E shown in FIG. 12 as an output-side standard cell, instead of the standard cell circuit 1B.

In these variations, since each of the semiconductor integrated circuit according to these variations has component identical to those of the semiconductor integrated circuit 100A, semiconductor integrated circuit 100A, the configuration of these variations can achieve effects similar to those of the semiconductor integrated circuit 100A described above.

Third Arrangement of the Semiconductor Integrated Circuit

Figure 16:
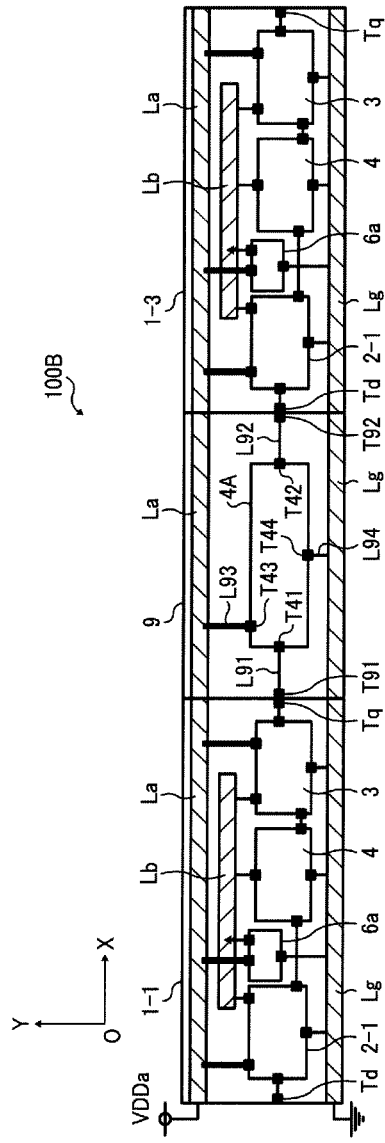
FIG. 16 is a plan view illustrating a layout of a semiconductor integrated circuit of a third arrangement.

FIG. 16 is a plan view illustrating a layout of a semiconductor integrated circuit 100B of a third arrangement. The semiconductor integrated circuit 100B includes a standard cell circuit 9 as a central standard cell circuit, instead of the standard cell circuit 1-2 of the semiconductor integrated circuit 100 shown in FIG. 14.

In FIG. 16, the central standard cell circuit 9 includes a standard cell 4A, wiring conductors La and Lg, lines L91, L92, L93, and L94, an input terminal T91, and an output terminal T92, configured in similar way to a conventional circuit configuration of the standard cell circuit corresponding to a large power supply voltage. The standard cell 4A includes an input terminal T41, an output terminal T42, a power supply terminal T43, a ground terminal T44, which performs a certain process for an input signal having a voltage level of 6 V, and outputs an output signal after the process.

In the central standard cell circuit 9, the wiring conductors La and Lg are formed similar to the wiring conductors La and Lg of the standard cell circuits 1 and 1A through 1G. The input terminal T41 of the standard cell 4A is connected to the (data) input terminal T91 via a line L91, the output terminal T42 is connected to the output terminal T92 via a line L92, the power supply terminal T43 is connected to the high-voltage wiring conductor La via a line L93, and the ground terminal T44 is connected to the ground-voltage wiring conductor Lg via a line L94.

In addition, in FIG. 16, one end of the high-voltage wiring conductor La of the input-side standard cell circuit 1-1 contacts one end of the high-voltage wiring conductor La of the central standard cell circuit 9 to electrically connect to each other, and the other end of the high-voltage wiring conductor La of the central standard cell circuit 9 contacts one end of the high-voltage wiring conductor La of the output-side standard cell circuit 1-3 to electrically connect to each other. Further, one end of the ground-voltage wiring conductor Lg of the input-side standard cell circuit 1-1 contacts one end of the ground-voltage wiring conductor Lg of the central standard cell circuit 9 to electrically connect to each other, and the other end of the ground-voltage wiring conductor Lg of the central standard cell circuit 9 contacts one end of the ground-voltage wiring conductor Lg of the output-side standard cell circuit 1-3 to electrically connect to each other.

The output terminal Tq of the input-side standard cell circuit 1-1 contacts the input terminal Td of the central standard cell circuit 9 to electrically connect to each other, and the output terminal Tq of the central standard cell circuit 9 contacts the input terminal Td of the output-side standard cell circuit 1-3 to electrically connect to each other.

In FIG. 16, an output signal from the standard cell 4 in the input-side standard cell circuit 1-1 is output to the standard cell 4A of the central standard cell circuit 9 via the output level shifter 3 of the input-side standard cell circuit 1-1. An output signal from the standard cell 4A in the central standard cell circuit 9 is output to the standard cell 4A of the output-side standard cell circuit 1-3 via the input level shifter 2-1 of the output-side standard cell circuit 1-3.

In FIG. 14, the standard cell 4 of the central standard cell circuit 1-2 operates as a D-type flip-flop circuit, which has a smaller layout area than that of the conventional standard cell.

However, as the number of MOS transistors in the standard cell 4 is few, the efficiency of the decrease in the layout area becomes smaller. In this case, the layout area of the conventional central standard cell circuit 9 having a standard cell circuit 4A operates at the power supply voltage VDDa may be smaller than that of the central standard cell circuit 1-2. In this case, the layout area of the semiconductor integrated circuit 100B shown in FIG. 16 can be smaller than that of the semiconductor integrated circuit 100 shown in FIG. 14.

Herein, the semiconductor integrated circuits 100, 100A, and 100B can be integrated on a single integrated circuit (IC) (computerized) device. With this configuration, the semiconductor device having small layout area and consumption power can be realized.

In above-described embodiments, the standard cell circuit 1 and 1A through 1G includes the standard cell that operates as the D-type flip-flop circuit, the present disclosure is not limited to the configuration described above. Alternatively, each of the standard cell circuit 1 and 1A through 1G may also include a standard cell that operates as a certain processor, for example, a 4-bit data latch circuit, an 8-bit data latch circuit, multiplexer, and an adder.

In addition, in above-described embodiments, although the power supply voltage VDDa is set to 6V, and the power supply voltage VDDb is set to 1.8V, the present disclosure is not limited to the values described above. The power supply voltage VDDb has only to be lower than the power supply voltage VDDa.

Numerous additional modifications and variations are possible in light of the above teachings. It is therefore to be understood that, within the scope of the appended claims, the disclosure of this patent specification may be practiced otherwise than as specifically described herein.

What is claimed is:

1. A standard cell circuit comprising:
an input terminal to which an input signal is input;
an output terminal to output an output signal;
a first wiring conductor, connected to an external power supply that outputs a first power supply voltage;
a second wiring conductor to supply a second power supply voltage that is lower than the first power supply voltage;
a standard cell to operate at the second power supply voltage supplied from the second wiring conductor; and
a conversion circuit, connected to the first wiring conductor and the second wiring conductor, to convert the first power supply voltage input from the first wiring conductor into the second power supply voltage for output to the second wiring conductor.

2. The standard cell circuit according to claim 1, wherein the conversion circuit comprises a regulator, connected to the first wiring conductor and the second wiring conductor, to convert the first power supply voltage input from the first wiring conductor into the second power supply voltage for output to the second wiring conductor.

3. The standard cell circuit according to claim 1, wherein the conversion circuit comprises an input level shifter, connected to the first wiring conductor and the second wiring conductor, and connected between the input terminal and the standard cell, to convert the first power supply voltage input from the first wiring conductor into the second power supply voltage for output to the second wiring conductor and shift a voltage level of the input signal input from the input terminal from a first power supply voltage level to a second power supply voltage level for output to the standard cell.

4. The standard cell circuit according to claim 1, wherein the conversion circuit comprises:
a regulator, connected to the first wiring conductor and the second wiring conductor, to convert the first power supply voltage input from the first wiring conductor into the second power supply voltage for output to the second wiring conductor; and
an input level shifter, connected between the input terminal and the standard cell, to shift a voltage level of the input signal input from the input terminal from a first power supply voltage level to a second power supply voltage level for output to the standard cell.

5. The standard cell circuit according to claim 1, further comprising:
an output level shifter, connected between the standard cell and the output terminal, to shift a voltage level of the output signal, output from the standard cell, from a second power supply voltage level to a first power supply voltage level for output via the output terminal.

6. A semiconductor integrated circuit including multiple standard cell circuits, comprising:
multiple input terminals, provided in respective standard cell circuits, to which an input signal is input;
multiple output terminals, provided in respective standard cell circuits, to output an output signal, each of the output terminals other than that of an output-side standard cell having one end electrically connected to an input terminal of an adjacent standard cell circuit;
a first wiring conductor, connected to an external power supply that outputs a first power supply voltage;
a second wiring conductor to supply a second power supply voltage that is lower than the first power supply voltage;
a standard cell to operate at the second power supply voltage supplied from the second wiring conductor;
a regulator, connected to the first wiring conductor and the second wiring conductor, to convert the first power supply voltage input from the first wiring conductor into the second power supply voltage for output to the second wiring conductor;
an input level shifter, connected between the input terminal and the standard cell, to shift the voltage level of the input signal input from the input terminal from a first power supply voltage level to a second power supply voltage level for output to the standard cell; and
an output level shifter, connected between the standard cell and the output terminal, to shift a voltage level of the output signal, output from the standard cell, from the second power supply voltage level to the first power supply voltage level for output via the output terminal.

7. The semiconductor integrated circuit according to claim 6, including two standard cell circuits comprising:
a first standard cell circuit comprising
an input terminal to which the input signal is input;
an output terminal;
a first wiring conductor, connected to the external power supply that outputs the first power supply voltage;
a second wiring conductor to supply the second power supply voltage that is lower than the first power supply voltage;
a standard cell to operate at the second power supply voltage supplied from the second wiring conductor;
an input level shifter, connected between the input terminal and the standard cell, to shift the voltage level of the input signal input from the input terminal from the first power supply voltage level to the second power supply voltage level for output to the first standard cell circuit and the second standard cell; and
a regulator, connected to the first wiring conductor and the second wiring conductor, to convert the first power supply voltage input from the first wiring conductor into the second power supply voltage for output to the second wiring conductor of the first standard cell circuit; and
a second standard cell circuit comprising
an input terminal, electrically connected to the output terminal of the first standard cell circuit;
an output terminal to output an out signal;
a first wiring conductor, having one end electrically connected to one end of the first wiring conductor of the first standard cell circuit;
a second wiring conductor, having one end electrically connected to one end of the second wiring conductor of the first standard cell circuit;
a standard cell to operate at the second power supply voltage supplied from second wiring conductor of the second standard cell circuit; and
an output level shifter, connected between the standard cell and the output terminal, to shift a voltage level of the output signals output from the standard cells of the first standard cell circuit and the second standard cell circuit, from the second power supply voltage level to the first power supply voltage level for output via the output terminal.

8. The semiconductor integrated circuit according to claim 6, including two standard cell circuits comprising:
a first standard cell circuit comprising:
an input terminal to which the input signal is input;
an output terminal;
a first wiring conductor, connected to the external power supply that outputs the first power supply voltage;
a second wiring conductor to supply the second power supply voltage that is lower than the first power supply voltage;
a standard cell to operate at the second power supply supplied from the second wiring conductor; and
an input level shifter, connected between the input terminal and the standard cell, to shift the voltage level of the input signal input from the input terminal from the first power supply voltage level to the second power supply voltage level for output to the standard cells of the first standard cell circuit and the second standard cell circuit; and a second standard cell circuit comprising:
an input terminal, electrically connected to the output terminal of the first standard cell circuit;
an output terminal to output the out signal;
a first wiring conductor, having one end electrically connected to one end of the first wiring conductor of the first standard cell circuit;
a second wiring conductor, having one end electrically connected to one end of the second wiring conductor of the first standard cell circuit, to supply a second power supply voltage that is lower than the first power supply voltage;
a standard cell to operate at the second power supply voltage supplied from the second wiring conductor;
a regulator, connected to the first wiring conductor and the second wiring conductor, to convert the first power supply voltage input from the first wiring conductor into the second power supply voltage for output to the second wiring conductor of the second standard cell circuit; and
an output level shifter, connected between the standard cell and the output terminal, to shift a voltage level of the output signals, output from the standard cells of the first standard cell circuit and the second standard cell circuit, from the second power supply voltage level to the first power supply voltage level for output via the output terminal.

9. The semiconductor integrated circuit according to claim 6, including two standard cell circuits, comprising:
a first standard cell circuit comprising:
an input terminal to which the input signal is input;
an output terminal;
a first wiring conductor, connected to the external power supply that outputs the first power supply voltage;
a second wiring conductor to supply the second power supply voltage that is lower than the first power supply voltage;
a standard cell to operate at the second power supply supplied from the second wiring conductor; and
a regulator, connected to the first wiring conductor and the second wiring conductor, to convert the first power supply voltage input from the first wiring conductor into the second power supply voltage for output to the second wiring conductor of the first standard cell circuit; and
a second standard cell circuit comprising:
an input terminal, electrically connected to the output terminal of the first standard cell circuit;
an output terminal to output the out signal;
a first wiring conductor, having one end electrically connected to one end of the first wiring conductor of the first standard cell circuit;
a second wiring conductor, having one end electrically connected to one end of the second wiring conductor of the first standard cell circuit, to supply a second power supply voltage that is lower than the first power supply voltage;
a standard cell to operate at the second power supply voltage supplied from the second wiring conductor;
an input level shifter, connected between the input terminal and the standard cell, to shift the voltage level of the input signal input from the input terminal from the first power supply voltage level to the second power supply voltage level for output to the standard cells of the first standard cell circuit and the second standard cell circuit; and an output level shifter, connected between the standard cell and the output terminal, to shift a voltage level of the output signals, output from the standard cells of the first standard cell circuit and the second standard cell circuit, from the second power supply voltage level to the first power supply voltage level for output via the output terminal.

10. The semiconductor integrated circuit according to claim 6, including two standard cell circuits, comprising:
a first standard cell circuit comprising:
an input terminal to which the input signal is input;
an output terminal;
a first wiring conductor, connected to the external power supply that outputs the first power supply voltage;
a second wiring conductor to supply the second power supply voltage that is lower than the first power supply voltage;
a standard cell to operate at the second power supply voltage supplied from the second wiring conductor;
a regulator, connected to the first wiring conductor and the second wiring conductor, to convert the first power supply voltage input from the first wiring conductor into the second power supply voltage for output to the second wiring conductor of the first standard cell circuit;
an input level shifter, connected between the input terminal and the standard cell, to shift the voltage level of the input signal input from the input terminal from the first power supply voltage level to the second power supply voltage level for output to the standard cell of the first standard cell circuit; and
an output level shifter, connected between the standard cell and the output terminal, to shift a voltage level of the output signal, output from the standard cell of the first standard cell circuit, from the second power supply voltage level to the first power supply voltage level for output via the output terminal of the first standard cell circuit; and
a second standard cell circuit identical to the first standard cell circuit; comprising the first wiring conductor having one end electrically connected to one end of the first wiring conductor of the first standard cell circuit, and the input terminal electrically connected to the output terminal of the first standard cell circuit.

11. The semiconductor integrated circuit according to claim 6, including three standard cell circuits comprising:
a first standard cell circuit comprising:
an input terminal to which the input signal is input;
an output terminal;
a first wiring conductor, connected to the external power supply that outputs the first power supply voltage;
a second wiring conductor to supply the second power supply voltage that is lower than the first power supply voltage;
a standard cell to operate at the second power supply voltage supplied from the second wiring conductor of the first standard cell circuit;
a regulator, connected to the first wiring conductor and the second wiring conductor, to convert the first power supply voltage input from the first wiring conductor into the second power supply voltage for output to the second wiring conductor of the first standard cell circuit regulator; and
an input level shifter, connected between the input terminal and the standard cell, to shift the voltage level of the input signal input from the input terminal from the first power supply voltage level to the second power supply voltage level for output to the standard cells of the first standard cell circuit, the second standard cell circuit, and the third standard cell circuit;
a second standard cell circuit comprising:
an input terminal, electrically connected to the output terminal of the first standard cell circuit;
an output terminal;
a first wiring conductor, having one end electrically connected to one end of the first wiring conductor of the first standard cell circuit;
a second wiring conductor, having one end electrically connected to one end of the second wiring conductor of the first standard cell circuit, to supply a second power supply voltage that is lower than the first power supply voltage; and
a standard cell to operate at the second power supply voltage supplied from the second wiring conductor of the second standard cell circuit; and
a third standard cell circuit comprising:
an input terminal, electrically connected to the output terminal of the second standard cell circuit;
an output terminal to output the out signal;
a first wiring conductor, having one end electrically connected to the other end of the first wiring conductor of the second standard cell circuit;
a second wiring conductor, having one end electrically connected to the other end of the second wiring conductor of the second standard cell circuit, to supply the second power supply voltage that is lower than the first power supply voltage;
a standard cell to operate at the second power supply voltage supplied from the second wiring conductor of the third standard cell circuit; and
an output level shifter, connected between the standard cell and the output terminal, to shift a voltage level of the output signals, output from the standard cells of the first standard cell circuit, the second standard cell circuit, and the third standard cell circuit, from the second power supply voltage level to the first power supply voltage level for output via the output terminal.

12. The semiconductor integrated circuit according to claim 6, including three standard cell circuits comprising:
a first standard cell circuit comprising:
an input terminal to which the input signal is input;
an output terminal;
a first wiring conductor, connected to the external power supply that outputs the first power supply voltage;
a second wiring conductor to supply the second power supply voltage that is lower than the first power supply voltage;
a standard cell to operate at the second power supply voltage supplied from the second wiring conductor; and
an input level shifter, connected between the input terminal and the standard cell, to shift the voltage level of the input signal input from the input terminal from the first power supply voltage level to the second power supply voltage level for output to the standard cells of the first standard cell circuit, the second standard cell circuit, and the third standard cell circuit;
a second standard cell circuit comprising:
an input terminal electrically connected to the output terminal of the first standard cell circuit;
an output terminal;
a first wiring conductor, having one end electrically connected to one end of the first wiring conductor of the first standard cell circuit;

a second wiring conductor, having one end electrically connected to one end of the second wiring conductor of the first standard cell circuit, to supply a second power supply voltage that is lower than the first power supply voltage;

a standard cell to operate at the second power supply voltage supplied from the second wiring conductor; and a regulator, connected to the first wiring conductor and the second wiring conductor, to convert the first power supply voltage input from the first wiring conductor into the second power supply voltage for output to the second wiring conductor of the second standard cell circuit; and a third standard cell circuit comprising:

an input terminal, electrically connected to the output terminal of the second standard cell circuit;

an output terminal to output the output signal;

a first wiring conductor, having one end electrically connected to the other end of the first wiring conductor of the second standard cell circuit;

a second wiring conductor, having one end electrically connected to the other end of the second wiring conductor of the second standard cell circuit, to supply a second power supply voltage that is lower than the first power supply voltage;

a standard cell to operate at the second power supply voltage supplied from the second wiring conductor; and an output level shifter, connected between the standard cell and the output terminal, to shift a voltage level of the output signals, output from the standard cells of the first standard cell circuit, the second standard cell circuit, and the third standard cell circuit, from the second power supply voltage level to the first power supply voltage level for output via the output terminal.

13. The semiconductor integrated circuit according to claim 6, including three standard cell circuits comprising:

a first standard cell circuit comprising:

an input terminal to which the input signal is input;

an output terminal;

a first wiring conductor, connected to the external power supply that outputs the first power supply voltage;

a second wiring conductor to supply the second power supply voltage that is lower than the first power supply voltage;

a standard cell to operate at the second power supply voltage supplied from the second wiring conductor; and an input level shifter, connected between the input terminal and the standard cell, to shift the voltage level of the input signal input from the input terminal from the first power supply voltage level to the second power supply voltage level for output to the standard cells of the first standard cell circuit, the second standard cell circuit, and the third standard cell circuit;

a second standard cell circuit comprising:

an input terminal electrically connected to the output terminal of the first standard cell circuit;

an output terminal;

a first wiring conductor, having one end electrically connected to one end of the first wiring conductor of the first standard cell circuit;

a second wiring conductor, having one end electrically connected to one end of the second wiring conductor of the first standard cell circuit, to supply a second power supply voltage that is lower than the first power supply voltage; and a standard cell to operate at the second power supply voltage supplied from the second wiring conductor; and a third standard cell circuit comprising:

an input terminal, electrically connected to the output terminal of the second standard cell circuit;

an output terminal to output the output signal;

a first wiring conductor, having one end electrically connected to the other end of the first wiring conductor of the second standard cell circuit;

a second wiring conductor, having one end electrically connected to the other end of the second wiring conductor of the second standard cell circuit, to supply a second power supply voltage that is lower than the first power supply voltage;

a standard cell to operate at the second power supply voltage supplied from the second wiring conductor;

a regulator, connected to the first wiring conductor and the second wiring conductor, to convert the first power supply voltage input from the first wiring conductor into the second power supply voltage for output to the second wiring conductor of the third standard cell circuit; and an output level shifter, connected between the standard cell and the output terminal, to shift a voltage level of the output signals, output from the standard cells of the first standard cell circuit, the second standard cell circuit, and the third standard cell circuit, from the second power supply voltage level to the first power supply voltage level for output via the output terminal.

14. The semiconductor integrated circuit according to claim 6, including three standard cell circuit comprising:

a first standard cell circuit comprising:

an input terminal to which the input signal is input;

an output terminal;

a first wiring conductor, connected to the external power supply that outputs the first power supply voltage;

a second wiring conductor to supply the second power supply voltage that is lower than the first power supply voltage;

a standard cell to operate at the second power supply voltage supplied from the second wiring conductor;

a regulator, connected to the first wiring conductor and the second wiring conductor, to convert the first power supply voltage input from the first wiring conductor into the second power supply voltage for output to the second wiring conductor;

an input level shifter, connected between the input terminal and the standard cell, to shift the voltage level of the input signal input from the input terminal from the first power supply voltage level to the second power supply voltage level for output to the standard cell; and an output level shifter, connected between the standard cell and the output terminal, to shift a voltage level of the output signal, output from the standard cell, from the second power supply voltage level to the first power supply voltage level for output via the output terminal;

a second standard cell circuit identical to the first standard cell circuit; comprising the first wiring conductor having one end electrically connected to one end of the first wiring conductor of the first standard cell circuit, and the input terminal electrically connected to the output terminal of the first standard cell circuit; and
a third standard cell circuit identical to the first standard cell circuit; comprising the first wiring conductor having one end electrically connected to the other end of the first wiring conductor of the second standard cell circuit, and the input terminal electrically connected to the output terminal of the second standard cell circuit.

15. The semiconductor integrated circuit according to claim 6, including three standard cell circuits, comprising:
a first standard cell circuit comprising:
an input terminal to which the input signal is input;
an output terminal;
a first wiring conductor, connected to the external power supply that outputs the first power supply voltage;
a second wiring conductor to supply the second power supply voltage that is lower than the first power supply voltage;
a standard cell to operate at the second power supply voltage supplied from the second wiring conductor;
a regulator, connected to the first wiring conductor and the second wiring conductor, to convert the first power supply voltage input from the first wiring conductor into the second power supply voltage for output to the second wiring conductor of first standard cell circuit;
an input level shifter, connected between the input terminal and the standard cell, to shift the voltage level of the input signal input from the input terminal from the first power supply voltage level to the second power supply voltage level for output to the standard cell of the first standard cell circuit; and
an output level shifter, connected between the standard cell and the output terminal, to shift a voltage level of the output signal, output from the standard cell of the first standard cell circuit, from the second power supply voltage level to the first power supply voltage level for output via the output terminal;
a second standard cell circuit comprising:
an input terminal, electrically connected to the output terminal of the first standard cell circuit;
an output terminal;
a first wiring conductor, having one end electrically connected to one end of the first wiring conductor of the first standard cell circuit; and
a standard cell to operate at the first second power supply voltage supplied from the first wiring conductor; and
a third standard cell circuit; comprising:
an input terminal, electrically connected to the output terminal of the second standard cell circuit;
an output terminal to output the output signal;
a first wiring conductor, having one end electrically connected to the other end of the first wiring conductor of the second standard cell circuit;
a second wiring conductor to supply the second power supply voltage that is lower than the first power supply voltage;
a standard cell to operate at the second power supply voltage supplied from the second wiring conductor;
a regulator, connected to the first wiring conductor and the second wiring conductor, to convert the first power supply voltage input from the first wiring conductor into the second power supply voltage for output to the second wiring conductor of third standard cell circuit;
an input level shifter, connected between the input terminal and the standard cell, to shift the voltage level of the input signal input from the input terminal from the first power supply voltage level to the second power supply voltage level for output to the standard cell of the third standard cell circuit; and
an output level shifter, connected between the standard cell and the output terminal, to shift a voltage level of the output signal, output from the standard cell of the third standard cell circuit, from the second power supply voltage level to the first power supply voltage level for output via the output terminal.

16. A semiconductor integrated circuit device comprising the semiconductor integrated circuit according to claim 6.

* * * * *